(12) United States Patent
Barndt et al.

(10) Patent No.: US 11,327,837 B2
(45) Date of Patent: May 10, 2022

(54) METHOD AND SYSTEM FOR IDENTIFYING ERASED MEMORY AREAS

(71) Applicant: Western Digital Technologies, Inc., San Jose, CA (US)

(72) Inventors: Richard David Barndt, San Diego, CA (US); Seyhan Karakulak, San Diego, CA (US); Scott Kayser, San Diego, CA (US); Majid Nemati Anaraki, San Diego, CA (US); Anthony Dwayne Weathers, San Diego, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/127,306

(22) Filed: Dec. 18, 2020

(65) Prior Publication Data

US 2021/0103496 A1   Apr. 8, 2021

Related U.S. Application Data

(63) Continuation of application No. 16/455,664, filed on Jun. 27, 2019, now Pat. No. 10,884,854, which is a continuation of application No. 15/662,199, filed on Jul. 27, 2017, now Pat. No. 10,387,246.

(60) Provisional application No. 62/525,127, filed on Jun. 26, 2017.

(51) Int. Cl.
| | |
|---|---|
| *G06F 11/10* | (2006.01) |
| *G11C 29/52* | (2006.01) |
| *H03M 13/29* | (2006.01) |
| *H03M 13/37* | (2006.01) |
| *H03M 13/11* | (2006.01) |

(Continued)

(52) U.S. Cl.
CPC ...... *G06F 11/1068* (2013.01); *G06F 11/1004* (2013.01); *G11C 29/52* (2013.01); *H03M 13/2906* (2013.01); *H03M 13/2948* (2013.01); *H03M 13/3707* (2013.01); *G11C 2029/0411* (2013.01); *H03M 13/1102* (2013.01); *H03M 13/1108* (2013.01); *H03M 13/1111* (2013.01); *H03M 13/152* (2013.01)

(58) Field of Classification Search
CPC .................................................. G06F 11/1068
USPC ............... 714/764, 762, 763, 765, 768, 770
See application file for complete search history.

(56) References Cited

U.S. PATENT DOCUMENTS

| | | |
|---|---|---|
| 6,662,263 B1 | 12/2003 | Wong |
| 2014/0195725 A1 | 7/2014 | Bennett |
| 2015/0049547 A1 | 2/2015 | Kim |

(Continued)

*Primary Examiner* — Fritz Alphonse
(74) *Attorney, Agent, or Firm* — Morgan, Lewis & Bockius LLP

(57) ABSTRACT

The subject technology provides for scanning blocks of a flash memory device for erased pages. A first codeword read from a page of a block in a flash memory device is received and provided to a first decoder for decoding. In response to receiving a first success indicator from the first decoder indicating that the first codeword was successfully decoded, first decoded data is provided from the first decoder to a second decoder for verification of the first decoded data. In response to receiving a first failure indicator from the second decoder indicating that the first decoded data was not verified, the page of the block is identified as being in an erased state based on the first success indicator received from the first decoder and the first failure indicator received from the second decoder.

20 Claims, 4 Drawing Sheets

(51) Int. Cl.
  *G11C 29/04* (2006.01)
  *H03M 13/15* (2006.01)

(56) References Cited

U.S. PATENT DOCUMENTS

2016/0274969 A1   9/2016   Chen
2018/0121343 A1   5/2018   Kim
2018/0373591 A1   12/2018   Bamdt
2019/0074850 A1*   3/2019   Hsiao ................ H03M 13/6566
2019/0130982 A1   5/2019   Reusswig

* cited by examiner

METHOD AND SYSTEM FOR IDENTIFYING ERASED MEMORY AREAS

CROSS-REFERENCE TO RELATED APPLICATIONS

This application is a continuation of application Ser. No. 16/455,664, filed on Jun. 27, 2019, now U.S. Pat. No. 10,884,854, which is a continuation of application Ser. No. 15/662,199, filed on Jul. 27, 2017, now U.S. Pat. No. 10,387,246, which claims the benefit of U.S. Provisional Application No. 62/525,127, filed on Jun. 26, 2017, the entirety of each of which is incorporated herein by reference for all purposes.

BACKGROUND

Flash memory, such as NAND flash memory, is organized into blocks with each block containing a number of pages. Data may be written to flash memory blocks sequentially one block at a time until all pages in the flash memory blocks have been programmed with data. Not all pages of a flash memory block may be in a programmed state due to low host writing activity or a power cycle or loss event before all pages in the flash memory block have been programmed.

SUMMARY

According to aspects of the subject technology, a method is provided for scanning for erased pages in a flash memory device. The method includes receiving a first codeword read from a page of a block in a flash memory device and providing the first codeword to a first decoder for decoding. The method further includes receiving a first success indicator from the first decoder indicating that the first codeword was successfully decoded and providing first decoded data from the first decoder to a second decoder for verification of the first decoded data in response to receiving the first success indicator. Upon receiving a first failure indicator from the second decoder indicating that the first decoded data was not verified, the page of the block is identified as being in an erased state based on the first success indicator received from the first decoder and the first failure indicator received from the second decoder.

According to other aspects of the subject technology, a processor-readable medium encoded with instructions is provided that, when the instructions are executed by a processor, a method is performed comprising configuring a first decoder and a second decoder to operate in a scanning configuration. For each block of a plurality of blocks in a flash memory device, the method includes receiving a first codeword read from a first page of the block and providing the first codeword to the first decoder for decoding. The method further includes receiving a first success indicator from the first decoder indicating that the first codeword was successfully decoded and providing first decoded data from the first decoder to a second decoder for verification of the first decoded data in response to receiving the first success indicator. The method further includes receiving a first failure indicator from the second decoder indicating that the first decoded data was not verified, and identifying the page of the block as being in an erased state based on the first success indicator received from the first decoder and the first failure indicator received from the second decoder.

According to aspects of the subject technology, a data storage system including a flash memory device comprising a plurality of blocks and a controller is provided. For each block of the plurality of blocks, the controller is configured to receive a first codeword read from a page of the block and provide the first codeword to a first decoder for decoding. The controller is further configured to receive either a success indicator from the first decoder if the first codeword is successfully decoded or a failure indicator from the first decoder if the first codeword is not decodable. If the failure indicator is received from the first decoder, the controller is configured to identify the page as being in a programmed state. If the success indicator is received from the first decoder, the controller is further configured to provide first decoded data from the first decoder to a second decoder for verification and receive either a success indicator from the second decoder if the first decoded data is verified or a failure indicator from the second decoder if the first decoded data is not verified. If the success indicator is received from the second decoder, the controller is further configured to identify the page as being in the programmed state, and if the failure indicator is received from the second decoder, the controller is further configured to identify the page as being in an erased state.

According to aspects of the subject technology, a data storage system including a flash memory device comprising a plurality of blocks is provided. The data storage system includes means for reading a first codeword from a page of a block of the plurality of blocks, means for decoding the first codeword read from the page of the block, and means for verifying decoded data received from the means for decoding. The data storage system further includes means for identifying the page of the block as being in an erased state if the means for decoding the first codeword successfully decodes the first codeword and the means for verifying the decoded data does not verify the decoded data.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
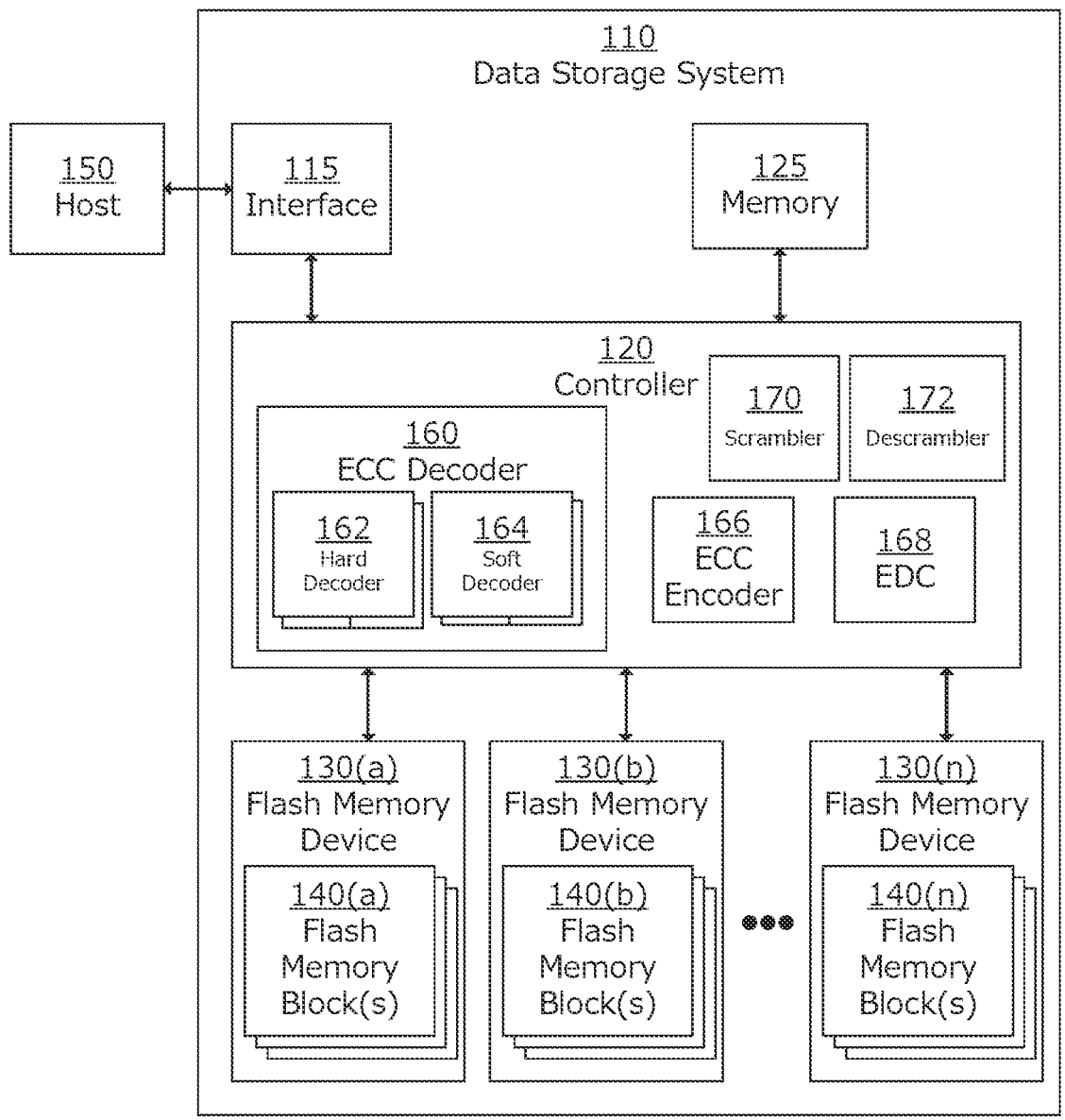
FIG. 1 is a block diagram illustrating components of a data storage system according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Flash memory, such as NAND flash memory, is organized into blocks with each block containing a number of pages. Data may be written to flash memory blocks sequentially one block at a time until all pages in the flash memory blocks have been programmed with data. Not all pages of a flash memory block may be in a programmed state due to low host writing activity or a power cycle or loss event before all pages in the flash memory block have been programmed. Data storage systems should have a robust means of finding the last programmed page in flash memory blocks.

Data storage systems may accomplish the task of finding the last programmed page in a block by reading a sequence of pages in each block, logically beginning with the last page in each block then proceeding in a pseudo binary search of the remaining pages until the last programmed page is found. For each page that undergoes a read operation, the data storage system must determine whether the page is in an erased state or a programmed state. For example, the bits of a page in an erased state will all be at a first logical value (e.g., "1"). In contrast, the bits of a page in a programmed state may have close to 50% of the bits at the first logical value (e.g., "1") and 50% of the bits at a second logical value (e.g., "0"). Further, a page in a programmed state should be decodable using an error-correcting code (ECC) decoder in the data storage system.

The subject technology advantageously utilizes hardware and/or software components of a data storage system configured in a scanning configuration to determine if the data read from a page has an all ones (1s) pattern, signifying an erased state, or a different pattern signifying a programmed state. According to aspects of the subject technology, an ECC decoder is configured such that a codeword in which all of the bits are at a first logical value (e.g., "1") is a valid codeword. In addition, an error-detecting code (EDC) decoder used to verify the decoded data from the ECC decoder is configured such that decoded data in which all of the bits are at the first logical state is not valid and therefore is not verified. In this manner, pages may be determined to be in an erased state based on the ECC decoder successfully decoding a codeword read from the page and the EDC decoder not verifying the decoded data from the ECC decoder.

FIG. 1 is a block diagram illustrating components of a data storage system 110 according to aspects of the subject technology. As depicted in FIG. 1, the data storage system 110 includes an interface 115, a controller 120, a memory 125, an ECC decoder 160, an ECC encoder 166, an EDC encoder/decoder 168, a scrambler 170, a descrambler 172, and flash memory devices 130. The interface 115 facilitates communication of data, commands, and/or control signals between the data storage system 110 and a host 150. The controller 120 controls the operation of the data storage system 110 to store and retrieve data in the flash memory devices 130 (e.g., illustrated as flash memory device 130(a), 130(b) to 130(n) to depict at least several devices) in accordance with commands received from the host 150. The controller 120 may include a single core processor or a multi-core processor which includes several separate computing cores for executing instructions. For example, the computing cores in the multi-core implementation may execute respective instructions in parallel including portions of the firmware of the data storage system 110. The memory 125, which may be a random access memory (RAM), provides temporary storage space for the controller 120 to process commands and transfer data between the host 150 and the flash memory devices 130. The ECC decoder 160, which may include memory, registers, logic gates, one or more processors, and may be integrated with or separate from the controller 120, decodes data read from the flash memory devices 130. The ECC encoder 166, which may include memory, registers, logic gates, one or more processors, and may be integrated with or separate from the controller 120, encodes data to be written to the flash memory devices 130. The operation of each of these components is described in more detail below.

The interface 115 may provide physical and electrical connections between the host 150 and the data storage system 110. The interface 115 is configured to facilitate communication of data, commands, and/or control signals between the host 150 and the data storage system 110 via the physical and electrical connections. The connections and the communications via interface 115 may be based on a standard interface such as Universal Serial Bus (USB), Small Computer System Interface (SCSI), Serial Advanced Technology Attachment (SATA), Mini-SATA (mSATA), Peripheral Component Interconnect Express (PCIe), etc. Alternatively, the connection and/or communications may be based on a proprietary interface, although the subject technology is not limited to any particular type of interface.

The host 150 may be a computing device, such as a computer/server, a smartphone, or any other electronic device that reads data from and writes data to the data storage system 110. The host 150 may have an operating system or other software that issues read and write commands to the data storage system 110. The data storage system 110 may be integrated with the host 150 or may be external to the host 150. The data storage system 110 may be wirelessly connected to the host 150, or may be physically connected to the host 150.

FIG. 1 shows multiple flash memory devices 130. The data storage system 110 may include one or more flash memory devices 130 and is not limited to a particular number of flash memory devices 130. The flash memory devices 130 may each include a single flash memory chip or die. The flash memory devices 130 may be organized among multiple channels through which data is read from and written to the flash memory devices 130 by the controller 120, or coupled to a single channel. The flash memory devices 130 may be implemented using NAND flash memory. The flash memory devices 130 may each include one or more registers for storing operating parameters of the respective flash memory devices 130. The operating parameters may include: read operation parameters such as read voltages; write operation parameters such as initial pulse value, incremental pulse value, and pulse width; and erase operation parameters such as initial pulse value, incremental pulse value, and pulse width.

The flash memory devices 130 comprise multiple memory cells distributed into storage blocks such as flash memory blocks 140. The flash memory devices 130 may have one or more flash memory blocks 140, and the flash memory devices 130 may each have the same or different numbers of flash memory blocks 140. The flash memory blocks 140 may be referred to as data blocks or memory blocks and are addressable by the controller 120 using a physical block address. Each of the flash memory blocks 140 is further divided into multiple data segments or pages addressable by the controller 120 using a physical page address or offset from a physical block address of the storage block containing the referenced page. The pages may store sectors or other host data units. The flash memory blocks 140 represent the units of data that are erased within the flash memory devices 130 in a single erase operation. The pages represent the units of data that are read from or written to the flash memory devices 130 in a read or write operation. Although the flash memory devices 130 are described in terms of blocks and pages, other terminology may be used to refer to these data units within a flash storage device.

The subject technology is not limited to any particular capacity of flash memory. For example, storage blocks may each comprise 32, 64, 128, or 512 pages, or any other number of pages. Additionally, pages may each comprise 512 bytes, 2 KB, 4 KB, or 32 KB, for example. The sectors may each comprise, for example, 512 bytes, 4 KB, or other sizes. There may be one or more sectors per page.

In FIG. 1, the memory 125 represents a volatile memory coupled to and used by the controller 120 during operation of the data storage system 110. The controller 120 may buffer commands and/or data in the memory 125. The controller 120 also may use the memory 125 to store address mapping tables or lookup tables used to convert logical addresses used by the host 150 into physical addresses corresponding to blocks and pages of the flash memory devices 130. Other types of tables, data, status indicators, etc. used to manage the flash memory devices 130 may also be stored in the memory 125 by the controller 120. For example, LLR (logarithmic likelihood ratio) tables may be stored in the memory 125. The memory 125 may be implemented using dynamic random access memory (DRAM), static random access memory (SRAM), or other types of volatile random access memory without departing from the scope of the subject technology. The controller 120 may periodically store the contents of the memory 125 into one or more designated flash memory blocks 140, such as before the data storage system 110 is powered down.

The controller 120 manages the flow of data between the host 150 and the flash memory devices 130. The controller 120 is configured to receive commands and data from the host 150 via the interface 115. For example, the controller 120 may receive data and a write command from the host 150 to write the data in the flash memory devices 130. The controller 120 is further configured to send data to the host 150 via the interface 115. For example, the controller 120 may read data from the flash memory devices 130 and send the data to the host 150 in response to a read command. The controller 120 is further configured to manage data stored in the flash memory devices 130 and the memory 125 based on internal control algorithms or other types of commands that may be received from the host 150. For example, the controller 120 is configured to perform operations such as garbage collection (GC), error correction, and wear leveling. Those skilled in the art will be familiar with other operations performed by a controller in a flash storage device, which will not be described in detail herein.

The controller 120 may be implemented with a general purpose processor, multi-core processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. In the multi-core processor implementation, each of the several computing cores can run respective instructions in parallel including portions of the firmware of the data storage system 110. The controller 120 may perform the operations and functions described herein by executing one or more sequences of instructions stored on a processor/machine/computer readable medium. The processor/machine/computer readable medium may be the flash memory devices 130, the memory 125, or other types of media from which the controller 120 can read instructions or code. For example, data storage system 110 may include a read only memory (ROM), such as an EPROM or EEPROM, encoded with firmware/software comprising one or more sequences of instructions read and executed by the controller 120 during the operation of the data storage system 110.

The ECC decoder 160, ECC encoder 166, EDC encoder/decoder 168, scrambler 170, and/or descrambler 172 may be implemented with a general purpose processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein.

The ECC decoder 160, ECC encoder 166, EDC encoder/decoder 168, scrambler 170, and/or descrambler 172 may be integrated with the controller 120, or may be separate. The ECC decoder 160 and the ECC encoder 166 may be configured to use LDPC. The ECC decoder 160 and the ECC encoder 166 may be configured to use additional or alternative decoding schemes. The ECC decoder 160 includes one or more hard decoders 162 and one or more soft decoders 164. The hard decoders 162 may be decoders that are reserved for hard decoding. Hard decoding limits the read bit values to either a "1" or a "0." Soft decoding, on the other hand, uses a range of values pulled from an LLR table, for example, to provide reliability or confidence measures that the read values are correct for use in an iterative decoding process. The LLR table allows the confidence values to be looked up based on the read outcomes. The soft decoders 164 may be decoders that are reserved for soft decoding. In certain implementations, the number of hard decoders 162 and the number of soft decoders 164 may be dynamically reserved from a pool of available decoders.

EDC encoder/decoder 168 may be configured to generate parity data using an error-detection code, such as a BCH code, for data received from host 150 to be written to flash memory device 130. The parity data may be include with the host data as part of a data payload provided to ECC encoder 166 for encoding for storage in flash memory device 130. EDC encoder/decoder 168 may process decoded data from ECC decoder 160 to verify the decoded data based on the parity data added prior to storing the data in the flash memory device 130. The verification is provided to help confirm that the data decoded by ECC decoder 160 was correctly decoded.

Scrambler 170 may be configured to scramble the data payload provided to ECC encoder 166 based on a seed value loaded into a configuration register for scrambler 170. The data payload may be scrambled to avoid sequences of bits all being programmed to a same logical value, which may reduce interference between adjacent memory cells in flash memory device 130. Descrambler 172 may be configured to descramble the decoded data provided by ECC decoder 160 to restore the bit order prior to providing the decoded data to EDC encoder/decoder 168 for verification.

For example, host 150 send a write request to data storage system 110 to write data to flash memory device 130. The controller 120 may receive and buffer the data from the host 150. The host data may be passed to EDC encoder/decoder 168 to processed using an EDC code to generate parity data. The host data together with the parity data may be passed to scrambler 170 to be scrambled prior to being encoded by ECC encoder 166 into a codeword. The controller 120 may and issue a program command to the flash memory device 130 to write the codeword into a page of block in the flash memory device.

Upon receiving a read command for the data from host 150, the controller 120 may issue a read command to the flash memory device 130 and receive the codeword read from the page of the block in the flash memory device. Decoder 160 may decode the codeword and generate decoded data and a success indicator indicating that the codeword was successfully decoded. The decoded data may be passed to descrambler 172 to reorder the bits of the decoded data prior to being passed to EDC encoder/decoder 168 for verification. EDC encoder/decoder 168 verifies the decoded data and generates a success indicator indicating that the decoded data received from the ECC decoder 160 is correct. The data is then returned to the host 150 via the interface 115.

ECC decoder 160 may be configured to decode a codeword using hard decoder 162 first. If hard decoder 162 is unsuccessful at decoding the codeword using a hard decoding operation, the codeword may be read again using a series of different read levels (e.g., seven different read levels) and passed to soft decoder 164 for an iterative soft decoding operation after each read. If neither the hard decoder 162 nor the soft decoder 164 are successful at decoding the codeword, a failure indicator is generated. The controller 120 may subsequently use other data recovering mechanisms (e.g., RAID) to recover the data written to the page. The hard and soft decoding processes summarized above also may by repeated if a false successful decode is detected by EDC encoder/decoder 168.

The pages of the flash memory blocks 140 in the flash memory devices may be in an erased state ready to be written to by controller 120 or in a programmed state containing codewords previously written to the pages. As noted above, some flash memory blocks 140 may have some pages in the programmed state and some pages in the erased state. The controller 120 may need to determine the last page to which data was written in the flash memory blocks 140 to determine the next page in a respective flash memory block 140 in an erased state and therefore available for writing data. For example, when the data storage system 110 is powered on, a scanning procedure may be initiated to scan each flash memory block 140 in each flash memory device 130 to determine which pages are in an erased state and available for write commands.

According to aspects of the subject technology, the scanning procedure to identify pages in the flash memory devices 130 in an erased state may be performed using components of the data storage system 110 configured to operate in a scanning configuration. The scanning procedure may utilize the decoder 160, for example hard decoder 162, configured to recognize a codeword having all bits in a first logical state (e.g., "1") as a valid codeword that successful decodes to generate decoded data. A page in an erased state will have all bits in the logical state of "1", for example, and therefore when the page is read a codeword made up of all bits in the logical state of "1" will be passed to the hard decoder 162. Decoder 160 may be configured using configuration parameters for the ECC code used by decoder 160 (e.g., LDPC) that recognize codewords having all bits in the logical state corresponding to an erased state. Accordingly, decoder 160 will generate a success indicator and provide decoded data comprising all bits having the logical state corresponding to the erased state when a page in an erased state is read.

To distinguish pages that may be in a programmed state containing data that was encoded using the same configuration parameters as used for the scanning procedure, EDC encoder/decoder 168 may be configured to not accept decoded data from the decoder 160 having all bits in the logical state corresponding to the erased state. Accordingly, if EDC encoder/decoder 168 receives decoded data from decoder 160 having all bits in the erased logical state, EDC encoder/decoder 168 returns a failure indicator. According to the scanning procedure, the controller 120 recognizes the combination of the decoder 160 returning a success indicator and EDC encoder/decoder 168 returning a failure indicator as indicating the page from which the codeword was read as being in an erased state. According to the scanning procedure, all other combinations of indicators from the decoder 160 and EDC encoder/decoder 168 are treated as indicating the page from which the codeword is read as being in a programmed state.

Regular LDPC codes are characterized by a parity check structure where each bit is an input to the same number of parity check equations (column weight) and each parity check equation has the same number of input bits (row weight). These codes are commonly used in many applications but are often modified to reduce the codeword length to a desired or needed size. This is often referred to as zero padding, where bits in the unused positions are encoded and decoded as zero values. In this manner the same encoder and decoder of the full length regular code can be utilized to operate on the shortened codewords with only knowledge of the unused locations.

A linear block code such as an LDPC code has the property that all parity checks will be satisfied if the input bits are all zeros but a regular LDPC code with even row weight also has the property that all parity checks are satisfied if the input bits are all 1's. Such a code can be directly used for detecting erased pages where all the bits are equal to 1 (with the exception of a tolerated small number of bits that fail the erase operation). Those skilled in the art will also recognize that any linear block code (including all LDPC codes) can be used in a similar way by simply inverting the bits before decoding, or by appropriate insertion of 1's in the decoder to produce an even row weight decoding operation.

Other configuration parameters may be used to configure the data storage system 110 in a scanning configuration. For example, if zero padding is used within the controller 120 when writing data to the flash memory devices 130, the number of zero pads may be set to zero in the scanning configuration parameters. Similarly, data is being scrambled and descrambled during standard read and write operations, a scrambler seed for descrambler 172 may be set to zero in the scanning configuration parameters. Soft decoders 164 may be disable in the scanning configuration so that only hard decoder 162 processes codewords for purposes of the scanning procedure. Since the actual values of programmed data is of no interest in the scanning procedure, the extra time and processing incurred during soft decoding processes is avoided by disabling the soft decoders 164 and the extra read operations incurred upon a hard decode failure. Under the scanning configuration, a hard decode failure is treated as indicating that the page is in a programmed state even if the actual values of the page are undecoded after a hard decode operation.

Figure 2:
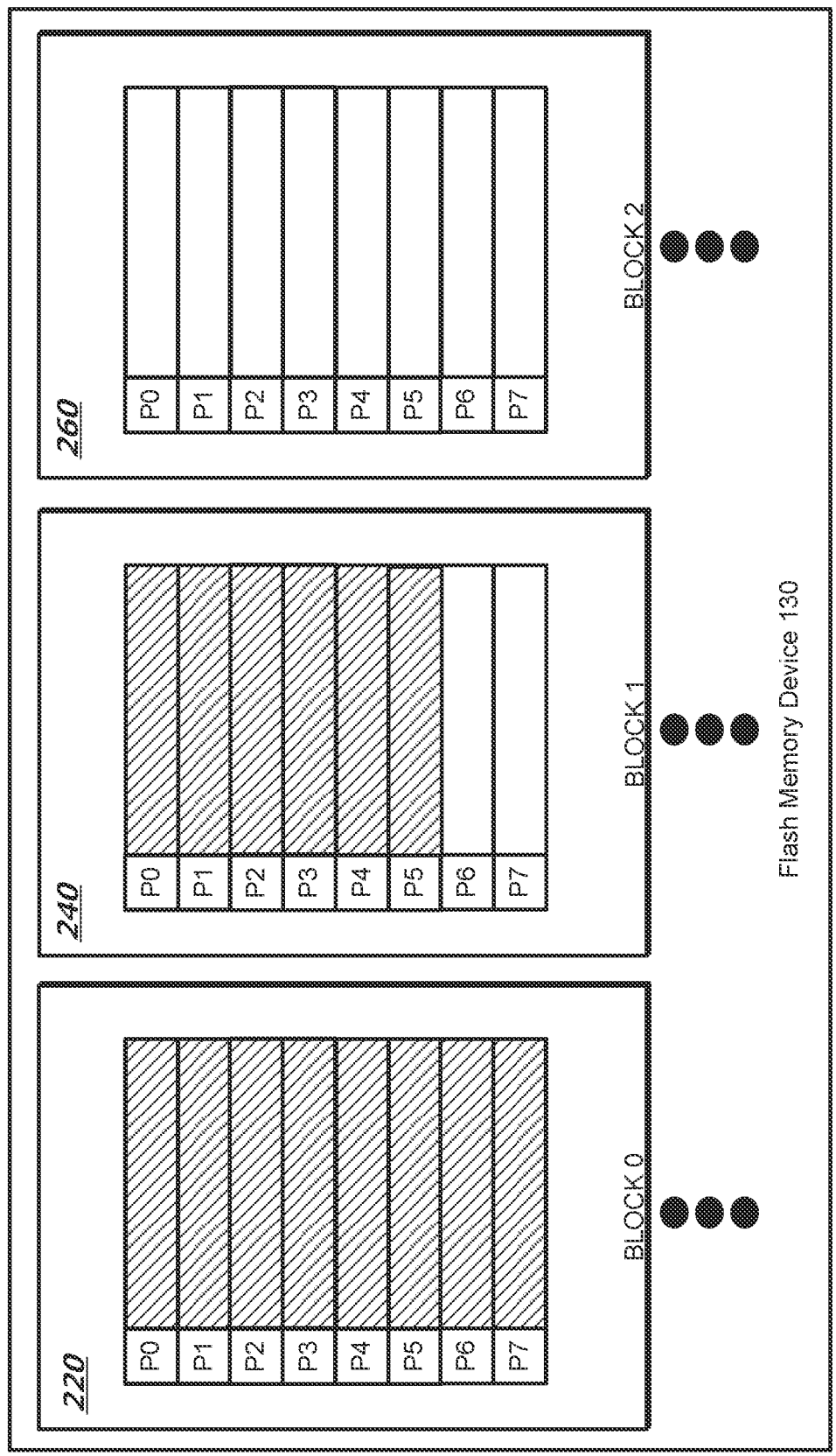
FIG. 2 illustrates an example blocks of a flash memory device according to aspects of the subject technology.

FIG. 2 illustrates an example depicting blocks of a flash memory device according to aspects of the subject technology. FIG. 2 will be discussed by reference to portions of FIG. 1, particularly with respect to the flash memory device 130.

As illustrated in FIG. 2, the flash memory device 130 includes block 220, 240, and 260. For the purpose of explanation, the three blocks are illustrated as each including eight pages, but it should be appreciated that the flash memory device 130 may include any number of appropriate blocks and/or appropriate number of pages included in each block.

Each block 220, 240, and 260 includes different numbers of pages that have written data and are in a programmed state. For example, block 220 includes all eight pages (e.g., P0-P7) that are in a programmed state. Block 240 includes five pages (e.g., pages P0-P5) that are in a programmed state and two pages (e.g., P6 and P7) in an erased state. Block 260, as illustrated, includes all eight pages (e.g., P0-P7) in an erased state.

In the example of FIG. 2, the controller 120 may initiate the scanning procedure described above and scan the pages of Blocks 220, 240 and 260 to determine the last page programmed by identifying pages in the blocks that are in an erased state. For example, controller 120 may read a codeword from each page and process the codeword according to the scanning procedure outlined above to determine if the page is in an erased state or in a programmed state. For purposes of this description the term "codeword" is intended to represent either an actual codeword stored in a page or a sequence of bits with a length equal to the length of an actual codeword in the situation where an erased page is being read as part of the scanning procedure. Because the pages of a block may be written to sequentially starting with a first page (e.g, P0), the scanning procedure may start with reading the last page in a block and continue reading pages in reverse order in the block until a page is determined to be in the programmed state. Other algorithms might be used by controller 120 to work through the pages of each block without having to read each page in the respective block. Once the first page in a block currently in the erased state is identified, the scanning procedure may move on to the next block in the flash memory device. This process may be repeated until all blocks in the flash memory device have been scanned according to the scanning procedure.

In an example, one or more registers provided in the data storage system 110 are programmed by firmware to satisfy the conditions listed in aforementioned table listing the configuration parameters. In one or more implementations, if a number of columns in a circulant matrix (e.g., used for performing a parity check of a LDPC code, which may be a square matrix such in which every row is obtained from the previous row by a cyclic shift to the right by one position) is an even number, then the all ones (1's) full length pattern will be a valid LDPC codeword. In an example, a number of zero pads is set to zero, and the scrambler 170 may be disabled or the scrambler seed is set to zero so that the all ones (1s) pattern will get passed to the EDC logic 168 for verification. By using these configuration parameters, advantageously, the outcome is deterministic when the ECC decoder 160 returns the all ones data payload. Further, the BCH seed for the EDC logic 168 is set to zero to prevent the all ones pattern from passing the EDC check.

Figure 3A:
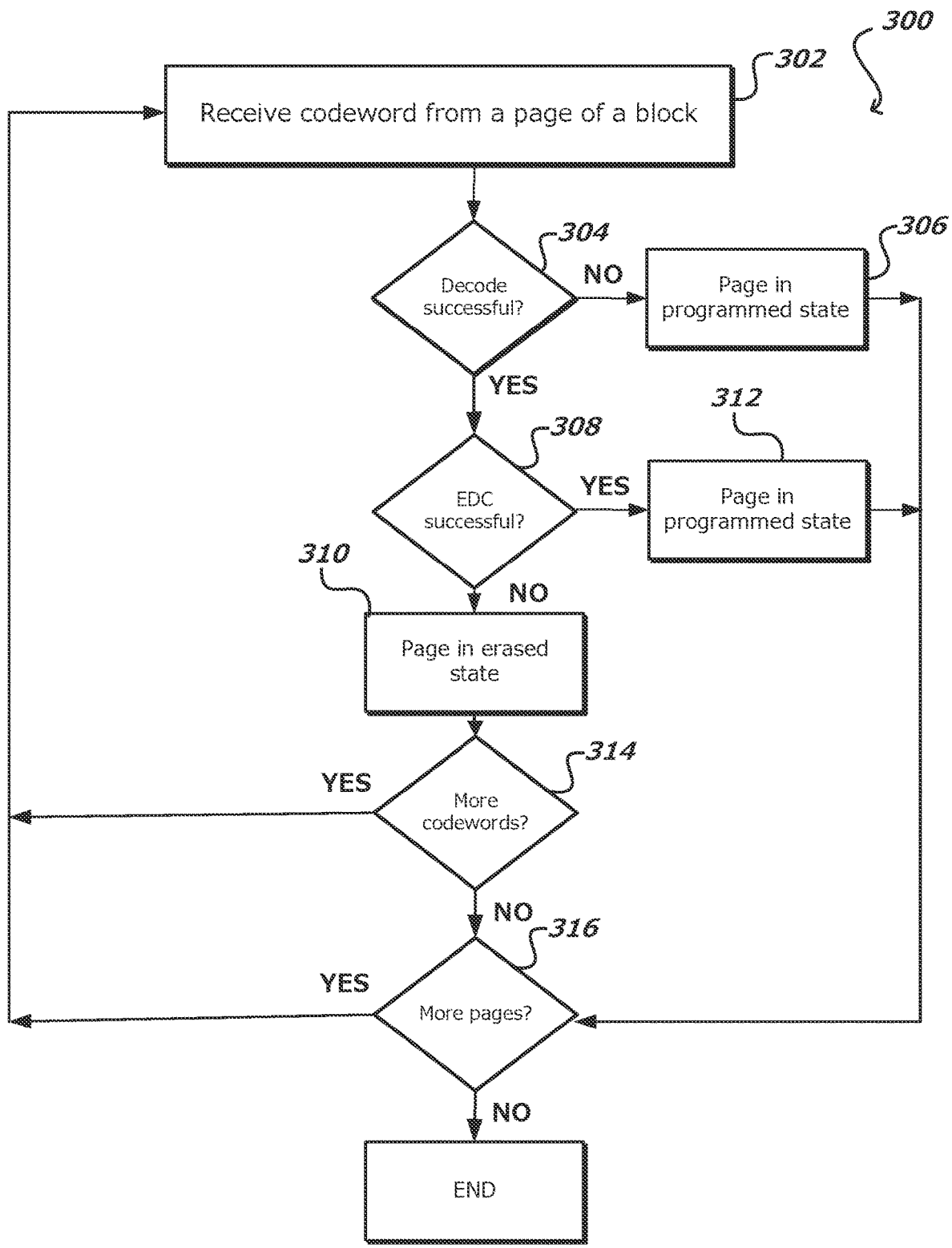
FIG. 3A shows a flowchart of a process for determining an erased page according to aspects of the subject technology.

FIG. 3A shows a flowchart of a process 300 for determining an erased page in accordance with one or more implementations. Further for explanatory purposes, the blocks of the process 300 are described herein as occurring in serial, or linearly. However, multiple blocks of the process 300 may occur in parallel. In addition, the blocks of the process 300 need not be performed in the order shown and/or one or more blocks of the process 300 need not be performed and/or can be replaced by other operations.

The process shown in FIG. 3A can be configured to process a single codeword or up to n number of codewords read from a single page. The controller 120 issues a read command to read data stored in a page of the flash memory device 130. The read command may be directed to a last page of a block of the flash memory device 130 (e.g., page P7 in block 220, 240 or 260), although it is appreciated that any appropriate page may be selected for the initial read command. A codeword read from the page of the block is received and passed to ECC decoder for hard decoding (block 302).

If a failure indicator is received from ECC decoder 160 (block 304) the page is identified as being in a programmed state (block 306) and processing of that page ends. If a success indicator is received from ECC decoder 160 (block 304), the decoded data generated by ECC decoder 160 is provided to EDC encoder/decoder 168 to verify the decoded data (block 308).

If the EDC encoder/decoder 168 returns a success indicator to indicate that the decoded data has been verified, the page is identified as being in a programmed state (block 312). If the EDC encoder/decoder 168 returns a failure indicator to indicate that the decoded data received from the ECC decoder 160 was not verified, the page is identified as being in an erased state (block 310). Identifying the page as being in an erased state may involve the controller 120 updating system data to reflect the state of the page. For example, controller 120 may maintain a list of all blocks and include data indicating the first page in each block in an erased state and therefore available for writing data. Controller 120 also may simply maintain a data structure indicating the next page available for writing and update the data structure based on the results of the scanning procedure.

The pages of the blocks in the flash memory devices 130 may each store multiple codewords. In these configurations, controller 120 may determine if data of another codeword remains unprocessed in the page (block 314). If data of another codeword is unprocessed in the page, the process returns and the next codeword is read from the page and received by the controller 120 from the flash memory device (block 320). If no unprocessed codewords remain in the page, the scanning process determines if another page in the block should be scanned according to the scanning procedure (block 316). If another page is to be processed, the process returns and a codeword from the next block is read from the page and received by the controller 120 (block 302). If no pages in the block remain to be processed, the scanning procedure for that block in the flash memory device ends. Process 300 may then be initiated for a next block in the flash memory device 130.

As noted above, the controller 120 may determine that data for another codeword remains unprocessed in the page (block 314) and repeat portions of the process for each codeword read from the page. For example, the controller 120 may read up to n number of codewords in the page and compare the results of each of those n number of read operations in accordance to the steps described above in FIG. 3A. Further details are discussed in FIG. 3B below.

Figure 3B:
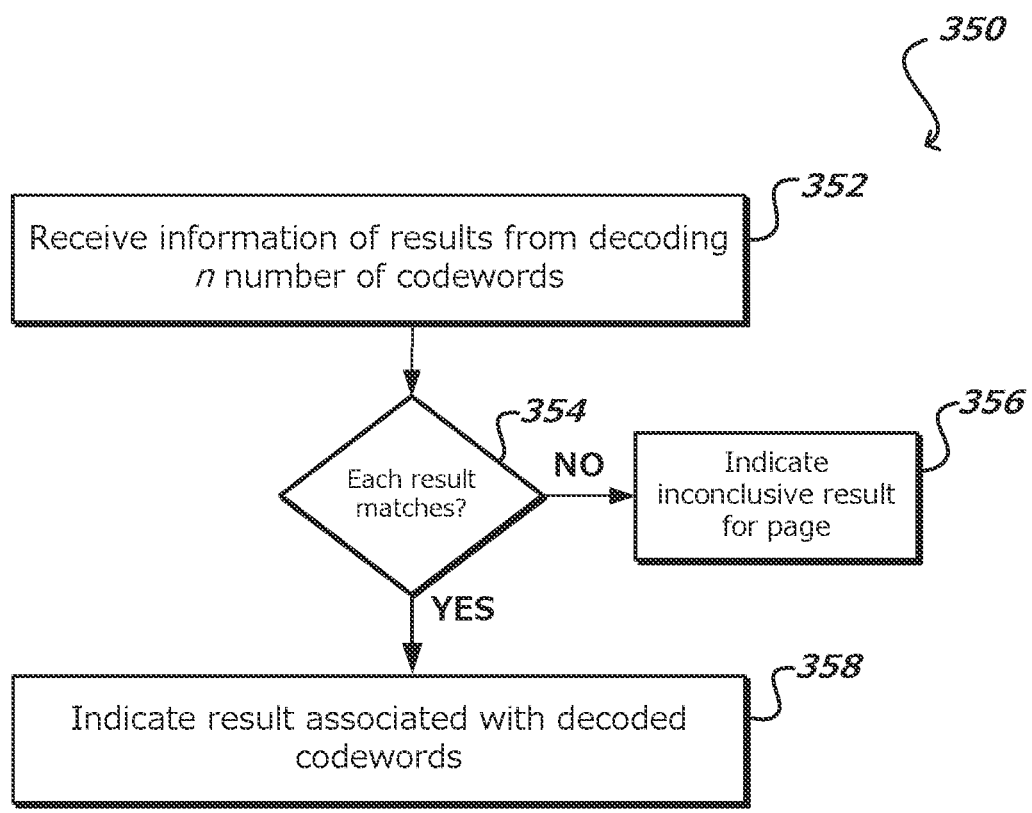
FIG. 3B shows a flowchart of a process for performing an analysis of more than one codeword in accordance with one or more implementations.

FIG. 3B shows a flowchart of a process 350 for performing an analysis of more than one codeword in accordance with one or more implementations. Further for explanatory purposes, the blocks of the process 350 are described herein as occurring in serial, or linearly. However, multiple blocks of the process 350 may occur in parallel. In addition, the blocks of the process 350 need not be performed in the order shown and/or one or more blocks of the process 350 need not be performed and/or can be replaced by other operations.

As discussed above, the controller 120 may perform the operations illustrated in FIG. 3B after reading and processing n number (where n represents a non-zero integer of two or greater) of codewords using the operations illustrated in FIG. 3A. After each iteration, the controller 120 may buffer the results identifying whether or not the page is in an erased state based on the processing of each respective codeword read from the page (block 352). After all of the codewords have been processed, and the state of the page identified based on each codeword, the controller 120 compares the results (block 354). If one of the codewords produces a different result than the other codewords, the results are determined to be inconclusive and the page is not identified as being in an erased state (block 356). For example, if only one of the codewords results in the page being identified as being in an erased state, the page is not identified as being in an erased state by the controller 120. If all of the codewords produce the same result, than the page is identified as being in the state corresponding to the result (block 358). For example, if all of the codewords read from the page result in the page being identified as being in an erased state, the controller 120 identifies the page as being in an erased state.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A machine-implemented method, comprising:
   receiving a first codeword, from a page of a memory, by a first decoder for decoding;
   responsive to the first codeword being decodable by the first decoder, providing first decoded data to a second decoder for verification;
   responsive to the first decoded data not being verified, identifying a first state of the page as being in an erased state;
   responsive to performing a decoding operation on a second codeword from the page, identifying a second state of the page as being in a state other than the erased state; and
   when the first state of the page corresponding to the first codeword is different from the second state of the page corresponding to the second codeword, identifying the page as being in a state other than the erased state.

2. The machine-implemented method of claim 1, wherein performing the decoding operation on the second codeword comprises:
receiving the second codeword by the first decoder for decoding;
when the second codeword is not decodable, identifying the second state of the page as being in a programmed state; and
when the second codeword is successfully decoded:
providing second decoded data to the second decoder for verification; and
when the second decoded data is verified, identifying the second state of the page as being in the programmed state.

3. The machine-implemented method of claim 1, wherein:
when the first codeword is not decodable by the first decoder, identifying the first state of the page as being in a programmed state; and
when the first codeword is successfully decoded by the first decoder and the first decoded data is verified, identifying the first state of the page as being in the programmed state.

4. The machine-implemented method of claim 1, comprising:
configuring the first decoder to operate in a scanning configuration, wherein codewords having all bits at a first logical value are decodable by the first decoder operating in the scanning configuration.

5. The machine-implemented method of claim 4, comprising:
configuring the second decoder to operate in the scanning configuration, wherein the codewords having all bits at the first logical value are not verifiable by the second decoder operating in the scanning configuration.

6. The machine-implemented method of claim 5, wherein the scanning configuration of the first decoder and the scanning configuration of the second decoder are different from a writing configuration used to encode data for writing to the memory.

7. The machine-implemented method of claim 1, comprising:
providing a first success indicator at the first decoder when the first codeword is successfully decoded by the first decoder;
providing a first failure indicator at the second decoder when the first decoded data is not verified by the second decoder;
providing a second success indicator at the first decoder when the second codeword is successfully decoded by the first decoder;
providing second decoded data from the first decoder to the second decoder for verification of the second decoded data in response to receiving the second success indicator; and
providing a second failure indicator at the second decoder when the second decoded data is not verified,
wherein the page is identified as being in the erased state when both the first and second success indicators and both the first and second failure indicators are provided.

8. The machine-implemented method of claim 7, wherein the page is not identified as being in the erased state when at least one of the following is not provided: the first success indicator, the second success indicator, the first failure indicator, or the second failure indicator.

9. The machine-implemented method of claim 1, wherein the first decoder is an error-correcting code decoder and the second decoder is an error-detecting decoder.

10. The machine-implemented method of claim 1, wherein the first decoder is a low-density parity-check decoder.

11. A data storage system, comprising:
a memory; and
one or more controllers configured to cause:
receiving a first codeword, from a page of the memory, by a first decoder for decoding;
responsive to the first codeword being decodable by the first decoder, providing first decoded data to a second decoder for verification;
responsive to the first decoded data not being verified, identifying a first state of the page as being in an erased state;
responsive to performing a decoding operation on a second codeword from the page, identifying a second state of the page as being in a state other than the erased state; and
when the first state of the page corresponding to the first codeword is different from the second state of the page corresponding to the second codeword, identifying the page as being in a state other than the erased state.

12. The data storage system of claim 11,
wherein performing the decoding operation on the second codeword comprises:
receiving the second codeword by the first decoder for decoding;
when the second codeword is not decodable, identifying the second state of the page as being in a programmed state; and
when the second codeword is successfully decoded:
providing second decoded data to the second decoder for verification; and
when the second decoded data is verified, identifying the second state of the page as being in the programmed state.

13. The data storage system of claim 11, wherein the one or more controllers are configured to cause:
when the first codeword is not decodable by the first decoder, identifying the first state of the page as being in a programmed state; and
when the first codeword is successfully decoded by the first decoder and the first decoded data is verified, identifying the first state of the page as being in the programmed state.

14. The data storage system of claim 11, wherein the one or more controllers are configured to cause:
configuring the first decoder to operate in a scanning configuration, wherein codewords having all bits at a first logical value are decodable by the first decoder operating in the scanning configuration.

15. The data storage system of claim 14, wherein the one or more controllers are configured to cause:
configuring the second decoder to operate in the scanning configuration, wherein the codewords having all bits at the first logical value are not verifiable by the second decoder operating in the scanning configuration.

16. The data storage system of claim 15, wherein the scanning configuration of the first decoder and the scanning configuration of the second decoder are different from a writing configuration used to encode data for writing to the memory.

17. An apparatus, comprising:
means for receiving a first codeword, from a page of a memory, by a first decoder for decoding;
means for, responsive to the first codeword being decodable by the first decoder, providing first decoded data to a second decoder for verification;
means for, responsive to the first decoded data not being verified, identifying a first state of the page as being in an erased state;
means for, responsive to performing a decoding operation on a second codeword from the page, identifying a second state of the page as being in a state other than the erased state; and
when the first state of the page corresponding to the first codeword is different from the second state of the page corresponding to the second codeword, means for identifying the page as being in a state other than the erased state.

18. The apparatus of claim 17,
wherein performing the decoding operation on the second codeword comprises:
  receiving the second codeword by the first decoder for decoding;
  when the second codeword is not decodable, identifying the second state of the page as being in a programmed state; and
  when the second codeword is successfully decoded:
    providing second decoded data to the second decoder for verification; and
    when the second decoded data is verified, identifying the second state of the page as being in the programmed state.

19. The apparatus of claim 17, comprising:
when the first codeword is not decodable by the first decoder, means for identifying the first state of the page as being in a programmed state; and
when the first codeword is successfully decoded by the first decoder and the first decoded data is verified, means for identifying the first state of the page as being in the programmed state.

20. The apparatus of claim 17, comprising:
means for providing a first success indicator at the first decoder when the first codeword is successfully decoded by the first decoder;
means for providing a first failure indicator at the second decoder when the first decoded data is not verified by the second decoder;
means for providing a second success indicator at the first decoder when the second codeword is successfully decoded by the first decoder;
means for providing second decoded data from the first decoder to the second decoder for verification of the second decoded data in response to receiving the second success indicator;
means for providing a second failure indicator at the second decoder when the second decoded data is not verified; and
means for identifying the page as not being in the erased state when at least one of the following is not provided: the first success indicator, the second success indicator, the first failure indicator, or the second failure indicator.

* * * * *